United States Patent
Horng (10) Patent No.: US 8,733,426 B2
(45) Date of Patent: May 27, 2014

(54) SLIM TYPE HEAT DISSIPATION DEVICE (76) Inventor: Chin-Fu Horng, Taipei Hsien (TW)

( * ) Notice: Subject to any disclaimer, the term of this patent is extended or adjusted under 35 U.S.C. 154(b) by 1017 days.

(21) Appl. No.: 12/814,650

(22) Filed: Jun. 14, 2010

(65) Prior Publication Data
US 2011/0247795 A1 Oct. 13, 2011

(30) Foreign Application Priority Data

Apr. 7, 2010 (TW) ................................ 99110681 A (51) Int. Cl.
*H05K 7/20* (2006.01)
(52) U.S. Cl.
USPC .......................... 165/80.3; 165/185; 361/704
(58) Field of Classification Search
CPC ............. H05K 7/2039; H05K 7/20509; H01L 23/3733; H01L 23/3735
See application file for complete search history.

(56) References Cited

U.S. PATENT DOCUMENTS

| | | | | |
|---|---|---|---|---|
| 6,027,807 A | * | 2/2000 | Inoue et al. | 428/408 |
| 6,257,329 B1 | * | 7/2001 | Balzano | 165/185 |
| 6,563,696 B1 | * | 5/2003 | Harris et al. | 165/185 |
| 7,799,428 B2 | * | 9/2010 | Fujiwara et al. | 165/185 |
| 2006/0225874 A1 | * | 10/2006 | Shives et al. | 165/185 |
| 2008/0289810 A1 | * | 11/2008 | Okabayashi | 165/185 |

* cited by examiner

*Primary Examiner* — Leonard R Leo
(74) *Attorney, Agent, or Firm* — Rosenberg, Klein & Lee (57) ABSTRACT

A heat dissipation device for transferring heat generated by a heat-producing element to a heat-dissipating element, includes a graphene plate, a main casing and a supporting plate. The graphene plate, in the form of relatively thin structure, has a first dissipation portion and a second dissipation portion extending from the first dissipation portion. The main casing, generally a planar structure, encloses the graphene plate therein, and has a first dissipation opening exposing the first dissipation portion of the graphene plate. The supporting plate extends integrally from the main casing in order to support the second dissipation portion of the graphene plate. The heat-producing element is inserted through the first dissipation opening in order to mount the same on the first dissipation portion of the graphene plate while the heat-dissipating element is mounted on the second dissipation portion of the graphene plate.

8 Claims, 10 Drawing Sheets

SLIM TYPE HEAT DISSIPATION DEVICE

This application claims the benefits of the Taiwan Patent Application Serial NO. 099110681, filed on Apr. 7, 2010, the subject matter of which is incorporated herein by reference.

BACKGROUND OF THE INVENTION

1. Field of the Invention

The present invention relates to a heat dissipation device, more particularly to a slim type heat dissipation device, which includes a graphene plate of relatively thin structure serving a heat dissipating medium for dissipating heat therefrom.

2. Description of the Prior Art

A conventional heat dissipation device generally includes a metal plate and a plurality of dissipating fins, which are mounted perpendicularly and equidistantly on an upper surface of the metal plate. A processing chip is mounted to a lower surface of the metal plate in such a manner that the heat generated from the processing chip is transferred to the fins via the metal plate for dissipating therefrom.

Since the electronic devices of late are to be produced in slim type and the slim type electronic devices can persuade the consumer to determine purchase of the same. However, in order to maintain a relatively high efficient of heat dissipation quality, each of abovementioned electronic devices should include dissipating fins with not tremendously small surface area. There should be sufficiently enough number of dissipating fins in order to maintain an appropriate heat dissipation quality. Since the height or thickness of the electronic device can not be lower further, the latter cannot satisfy the demand of slim type trend.

SUMMARY OF THE INVENTION

In order to overcome the prior art drawbacks, the object of the present invention is to provide a heat dissipation device, which uses a graphene plate of relatively thin structure as the heat dissipating medium for transferring the heat generated by a heat producing element to a heat dissipating element. In addition, a main casing of substantially flat is used for enclosing and overlapping the graphene plate from top and bottom surfaces thereof to support and strength the rigidity of the graphene plate, thereby enabling the heat dissipation device to be slim type.

Another object of the present invention is to provide a slim type heat dissipation device for transferring heat generated by a heat-producing element to a heat-dissipating element, includes a graphene plate, a main casing and a supporting plate. The graphene plate, in the form of relatively thin structure, has a first dissipation portion and a second dissipation portion extending from the first dissipation portion. The main casing, generally a planar structure, encloses the graphene plate therein, and has a first dissipation opening exposing the first dissipation portion of the graphene plate. The supporting plate extends integrally from the main casing in order to support the second dissipation portion of the graphene plate. The heat-producing element is inserted through the first dissipation opening in order to mount the same on the first dissipation portion of the graphene plate while the heat-dissipating element is mounted on the second dissipation portion of the graphene plate.

As described above, in the heat dissipation device of the present invention, a graphene plate of relatively thin structure serves as the heat dissipation medium for transferring the heat generated by the heat producing element to the heat dissipating element. In addition, the main casing itself is substantially flat, encloses and overlaps the graphene plate from top and bottom surfaces thereof so as to effectively reduce an overall height of the heat dissipation device of the present invention. In the event, the heat generated by the heat producing element is relatively high, the graphene plate can be mounted on the metal casing of the electronic device or onto a thin metal plate of the metal casing in order to increase the overall heat dissipating area. Since the metal casing itself can dissipate the heat therefrom, the overall height of the heat dissipation device of the present invention is reduced when compared to the prior art ones.

BRIEF DESCRIPTION OF THE DRAWINGS

Other features and advantages of this invention will become more apparent in the following detailed description of the preferred embodiments of this invention, with reference to the accompanying drawings, in which:

FIGS. 5 and 6 are perspective views of the third embodiment of the heat dissipation device of the present invention, wherein FIG. 6 is a upside down view of FIG. 5;

DETAILED DESCRIPTION OF THE PREFERRED EMBODIMENTS

Figure 1:
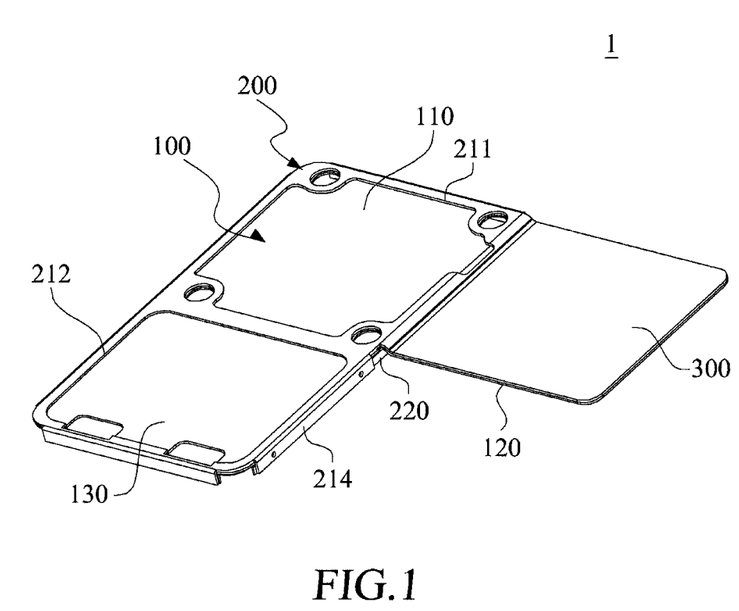
FIG. 1 is a perspective view of the first embodiment of a slim-type heat dissipation device of the present invention.

FIG. 1 is a perspective view of the first embodiment of a slim-type heat dissipation device 1 of the present invention. The slim-type heat dissipation device 1 of the present invention is to be implemented within a relatively thin mobile phone or notebook computer, since the latter is in the trend to be in the slim-type. The slim-type heat dissipation device 1 of the present invention is to transfer or dissipate the heat generated by the heat producing element 21, 22 to a heat dissipating element 3 (see FIG. 4).

Figure 2:
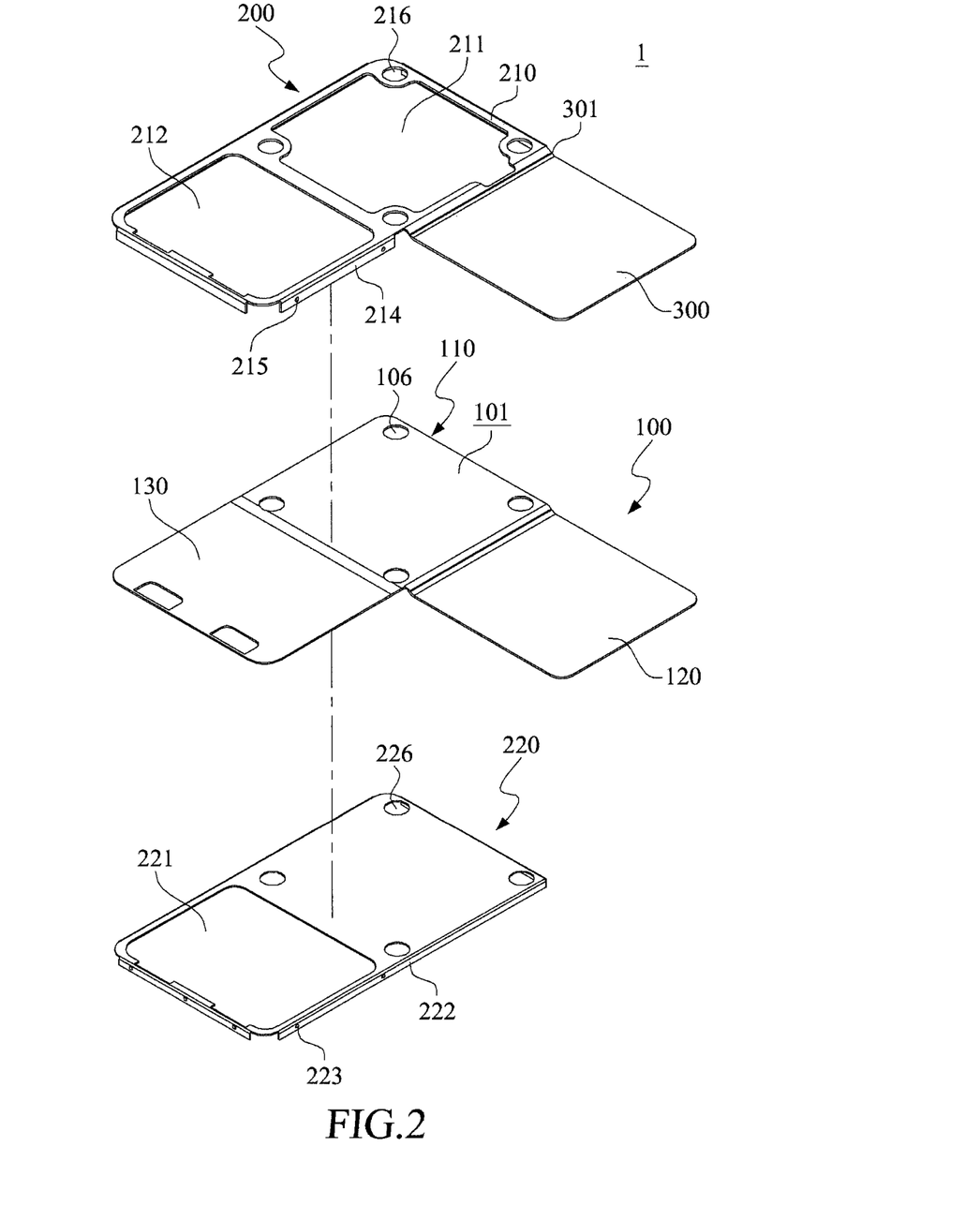
FIG. 2 is an exploded view of the first embodiment of the heat dissipation device of the present invention.
Figure 3:
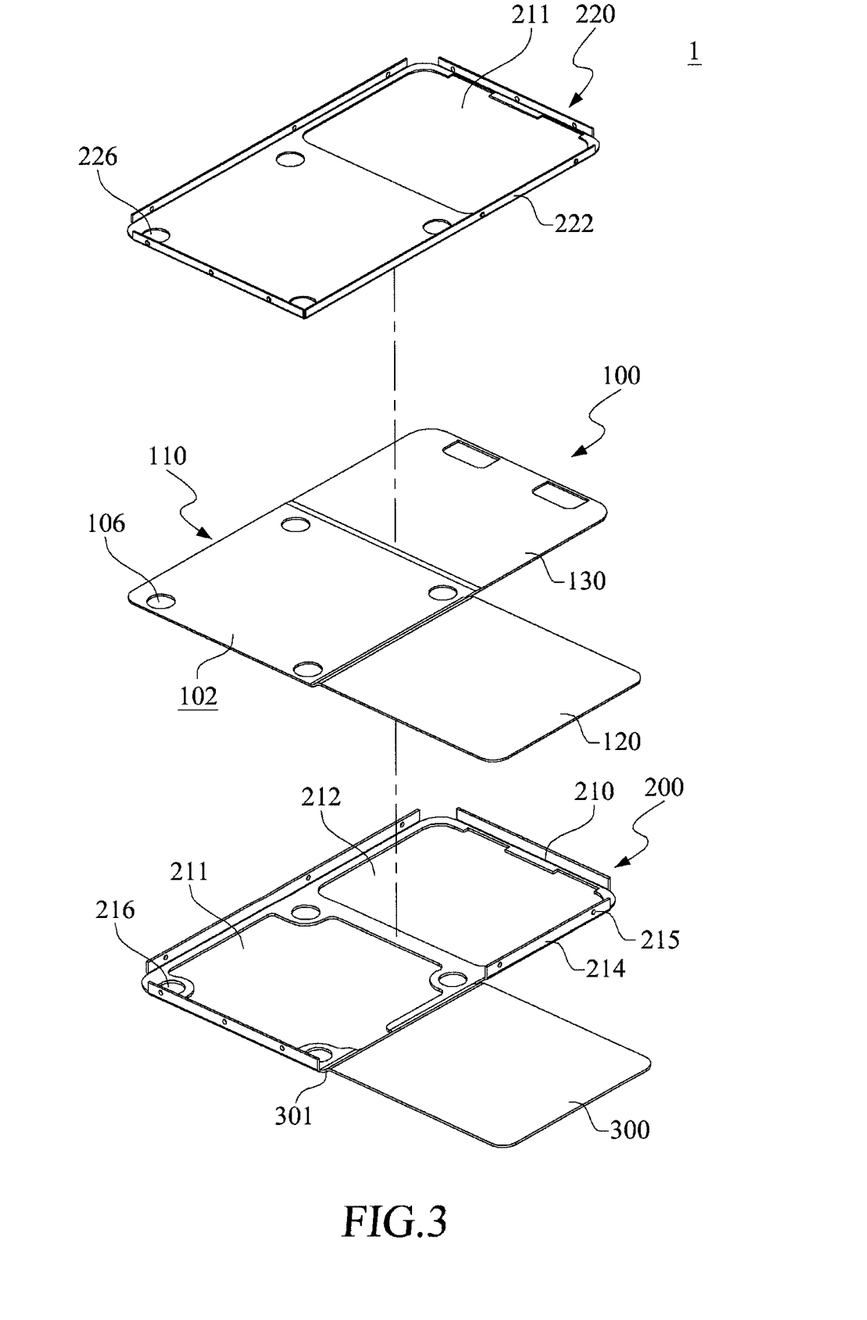
FIG. 3 is an exploded view of the first embodiment of the heat dissipation device of the present invention, wherein the elements are turned upside down to illustrate lower configuration thereof.

Referring to FIGS. 2 and 3, wherein FIG. 2 is an exploded and perspective view of the first embodiment of the heat dissipation device of the present invention while the elements in FIG. 3 are turned upside down to illustrate lower configuration thereof. As shown, the heat dissipation device 1 of the present invention includes a graphene plate 100, a main casing 200 and a supporting plate 300. The graphene plate 100 is generally made from graphene materials and more than 90% of its weight (up to 98%) is made from graphene materials. In order to enhance the strength thereof, glue or adhesive can be added into the graphene plate 100 during the fabrication process thereof. In this embodiment, the graphene plate 100 is pressed in the form of relatively thin structure.

The graphene plate 100 has top and bottom surfaces 101, 102, a first dissipation portion 110, a second dissipation 120 extending integrally from the first dissipation portion 110 and a third dissipation portion 130 extending from the first dissipation portion 110 in such a manner that the graphene plate 100 is substantially in L-shaped structure. However, the design of the first, second and third dissipation portions 110, 120, 130 should not be limited only to the L-shaped structure, and can be varied depending on the product structure. The first dissipation 110 is formed with a plurality of screw holes 106 around the periphery thereof.

The main casing 200 and the supporting plate 300 are generally planar structures. The supporting plate 300 extends integrally from the main casing 200 in order to support the second dissipation portion 120 thereabove. In this embodiment, the main casing 200, the supporting plate 300 and the graphene plate 100 are generally parallel to and are overlapped with one another. The main casing 200 further encloses the top and bottom surfaces of the graphene plate 100 in such a manner to provide rigidity of the graphene plate 100. In this embodiment, the main casing 200 and the supporting plate 300 are made from the same material, preferably metal, but should not be limited thereto.

The main casing 200 preferably includes an upper casing half 210 enclosing the graphene plate 100 from the top surface 101 and a lower casing half 220 enclosing the graphene plate 100 from the lower surface 102 via an engagement structure. The upper casing half 210 has a first dissipating opening 211, a second dissipating opening 212 and a first engagement structure 214. The lower casing half 220 has a third dissipating opening 221 and a second engagement structure 222. After assembly, the top surface 101 of the first dissipation portion 110 in the graphene plate 100 is exposed from the first dissipating opening 211 such that the heat producing element or heat dissipating element can be mounted on the top surface 101 of the first dissipation portion 110. Moreover, the top surface 101 of the third dissipation portion 130 is exposed from the second dissipating opening 212 while the bottom surface 102 of the third dissipation portion 130 is exposed from the third dissipating opening 221. Another heat producing element or another heat dissipating element can be passed through the second or third dissipating openings 212, 221 in order to mount the same on the top or bottom surfaces 101, 102 of the third dissipation portion 130.

In this embodiment, the graphene plate 100 further has a fourth dissipation portion, a fifth dissipation portion and etc., and at every dissipation portion, a heat producing element or heat dissipating element can be mounted thereto.

When the upper and lower casing halves 210, 220 enclose the graphene plate 100 from the top and bottom surfaces 101, 102, the first and second engagement structures 214, 222 engage relative to each other. In this embodiment, the first engagement structure 214 includes an engaging recess 215 while the second engagement structure 222 includes an engaging projection 223 for extending into and engaging the engaging recess 215 once the first and second engagement structures 214, 222 engage relative to each other.

Figure 4:
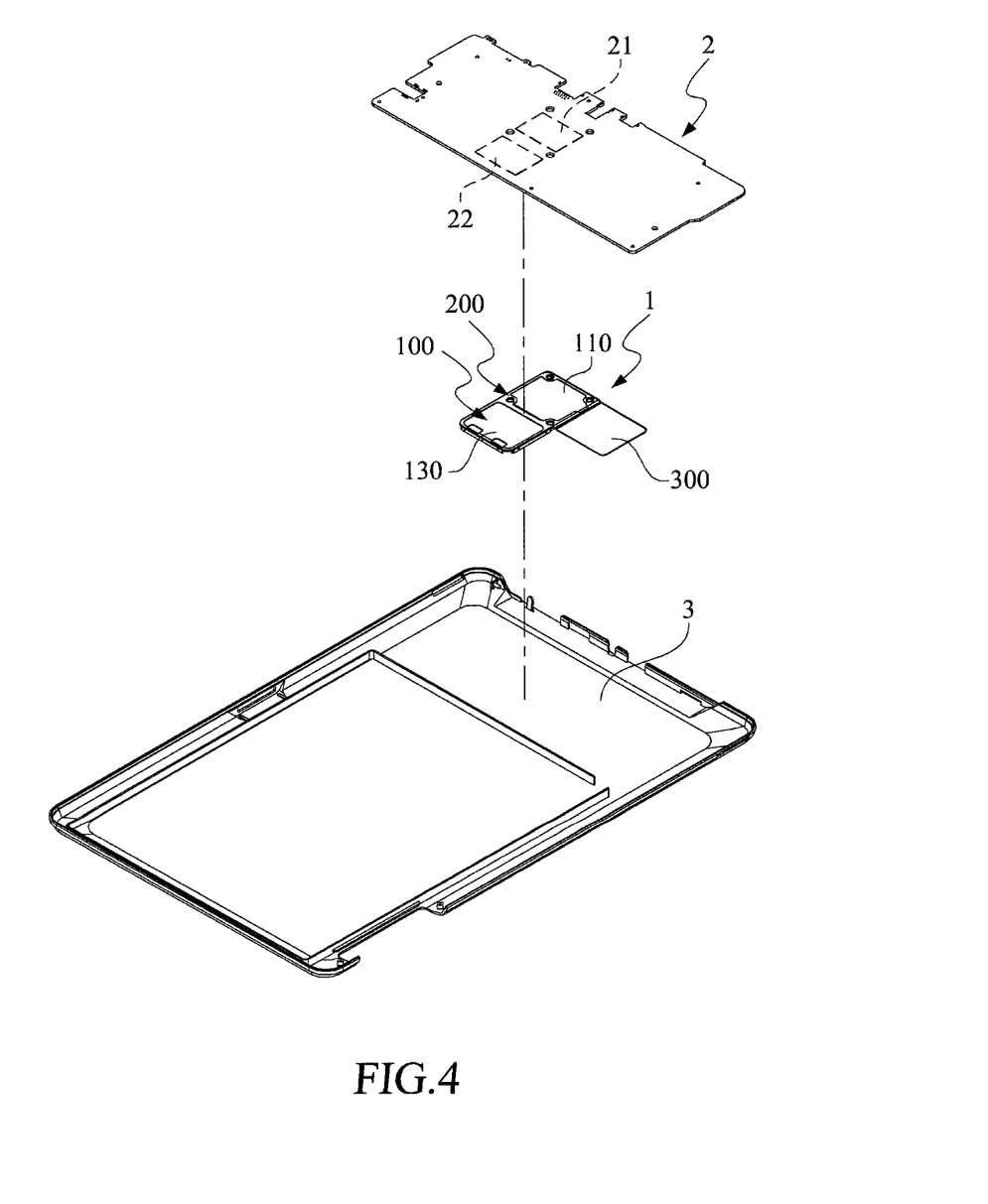
FIG. 4 illustrates the heat dissipation device of the present in application.

The upper casing half 210 and the lower casing half 220 can be formed with a plurality of screw holes 216, 226 respectively aligned with the screw holes 106 in the graphene plate 100 for extension of fastener screws (not shown) for coupling the assembly onto an object, such as a printed circuit board 2, as best shown in FIG. 4. The number of dissipating openings in the upper and lower casing halves 210, 220 should not be limited. For instance, in another embodiment, the second and third dissipating openings 212, 221 can be excluded or only the second dissipating opening 212 is implemented in order to expose the top surface of the third dissipation portion 130 of the graphene plate 100.

The supporting plate 300 is provided with a foldable strip 301, which is attached integrally to the upper casing half 210 in such a manner that the top surface 101 of the second dissipation portion 120 abuts against the foldable strip 301 and the supporting plate 300, thereby providing an additional strength to prevent breakage of the graphene plate 100. Due the foldable strip 301, a height difference is resulted between the first and second dissipation 110, 120 such that when the heat producing element or heat dissipating element is attached to the bottom surface of the second dissipation portion 120, the supporting plate 300 is closely located to the heat dissipating element 3, which, in turn, results in tight abutment between the second dissipation portion 120 and the heat dissipating element 3.

In another embodiment, the supporting plate 300 extends outwardly from one side of the lower casing half 220 so that the second dissipation portion 120 of the graphene plate 100 is attached on the surface of the supporting plate 300. Preferably, the supporting plate 300 is formed with a dissipating opening if required.

FIG. 4 illustrates the heat dissipation device of the present in application, wherein the heat producing element 21, 22 can be any electronic components, such as processing chips that generate heat when operated. The heat producing elements 21, 22 are installed on the printed circuit board 2 while the heat dissipating element 3 may include a metal casing, like metal casing of mobile phone or metal casing of notebook computer. In another embodiment, the heat dissipating element 3 can include a relatively thin plate provided within a metal casing or a heat sink with a plurality of dissipating fins for effectively dissipating heat therefrom.

In FIG. 4, the heat producing element 21 is installed on the first dissipation portion 110, another heat producing element 22 is installed on the second dissipation portion 120 (see FIG. 3) while the heat dissipating element 3 is installed on the bottom surface 102 of the second dissipation portion 120. Due to tight abutment between the supporting plate 300 and the second dissipation portion 120, the latter is closely contact with the heat dissipating element 3.

Figure 4A:
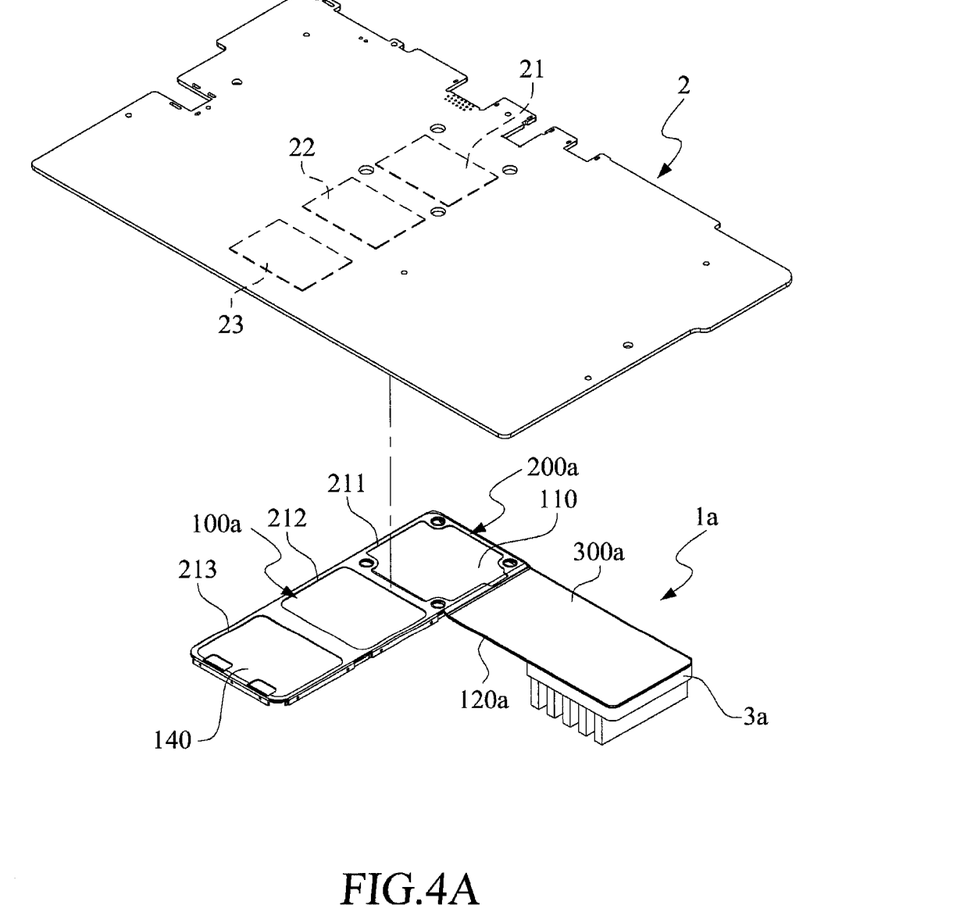
FIG. 4A illustrates the second embodiment of the heat dissipation device of the present invention in application.

FIG. 4A illustrates the second embodiment of the heat dissipation device of the present invention in application. As illustrated, the heat dissipating element 3a is located relatively far from the heat producing element 21 so that the supporting plate 300a and the second dissipation portion 120a are arranged longer than that of the first embodiment. Thus, the heat dissipating element 3a can be installed on the second dissipation portion 120a. The heat dissipating element 3a can include several pieces of dissipating fins.

As illustrated in FIG. 4A, the second embodiment of the heat dissipation of the present invention further includes another heat producing element 23 located relatively far away from the heat producing element 21, the longitudinal length of the graphene plate 100a is consequently lengthened to possess a fourth dissipation portion 140 extending from the third dissipation portion 130. Alternately, the fourth dissipation portion 140 may extend either from the first or second dissipation portion 110, 120, however the limitation should not be limited thereto. The main casing 200a should also complement with the graphene plate 100a, and thus possesses a fourth dissipating opening 214 such that the heat producing element 23 can be installed on the fourth dissipation portion 140 via the fourth dissipating opening 214.

Figure 5:
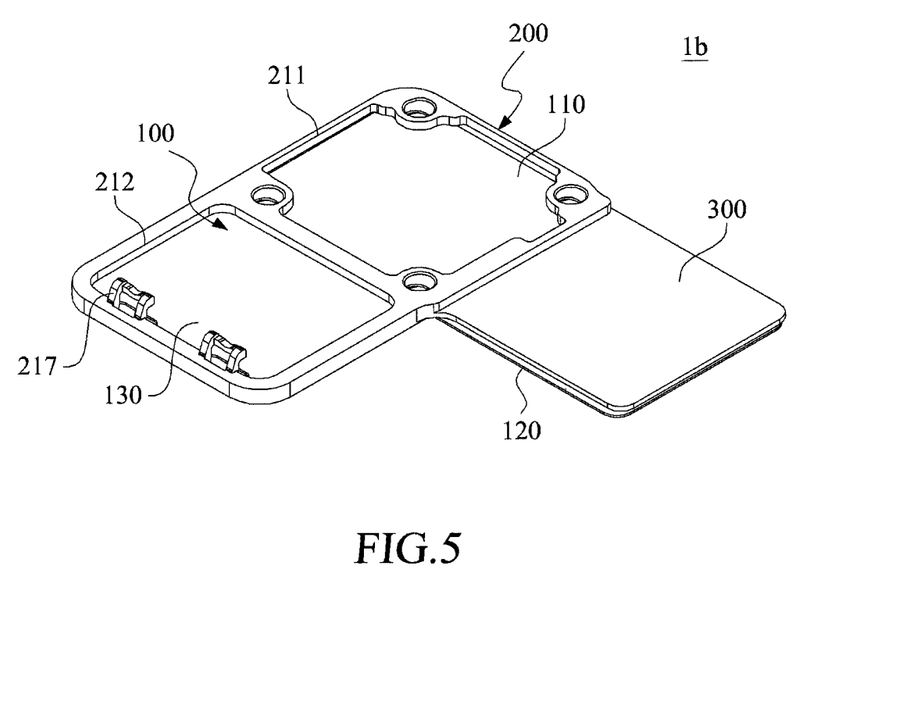
Figure 6:
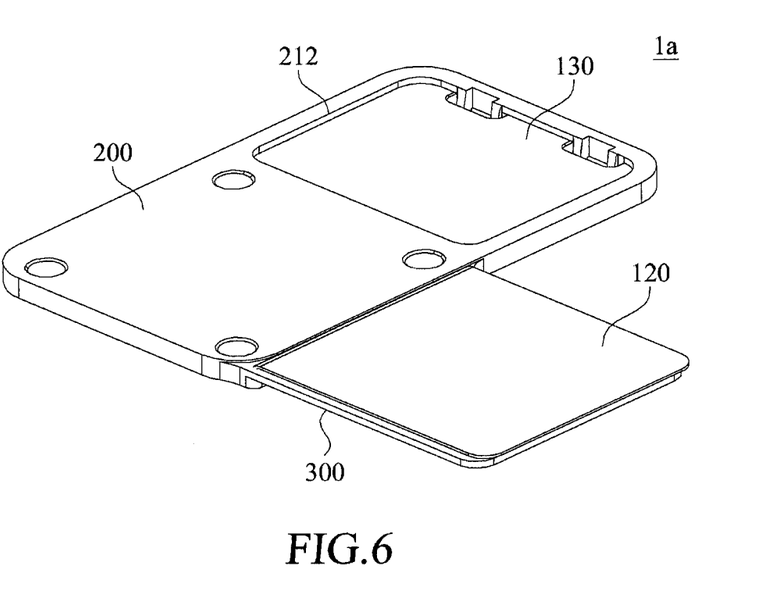

FIGS. 5 and 6 are perspective views of the third embodiment of the heat dissipation device 1a of the present invention, wherein the elements in FIG. 6 are shown upside down relative to FIG. 5. The third embodiment is different from the first embodiment except in that the main casing 200 and the supporting plate 300 are made from plastic material. The main casing 200 and the supporting plate 300 are mounted onto the graphene plate 100 via the insert molding process so as to exclude the upper and lower casing halves and the first and second engagement structures 214, 222 as in the first embodiment. Thus, overall height of the second embodiment of the heat dissipation device of the present invention can be reduced. An engagement structure 217 can be formed on the main casing 200 for engaging one lateral side of the printed circuit board 2 (see FIG. 4).

Figure 7:
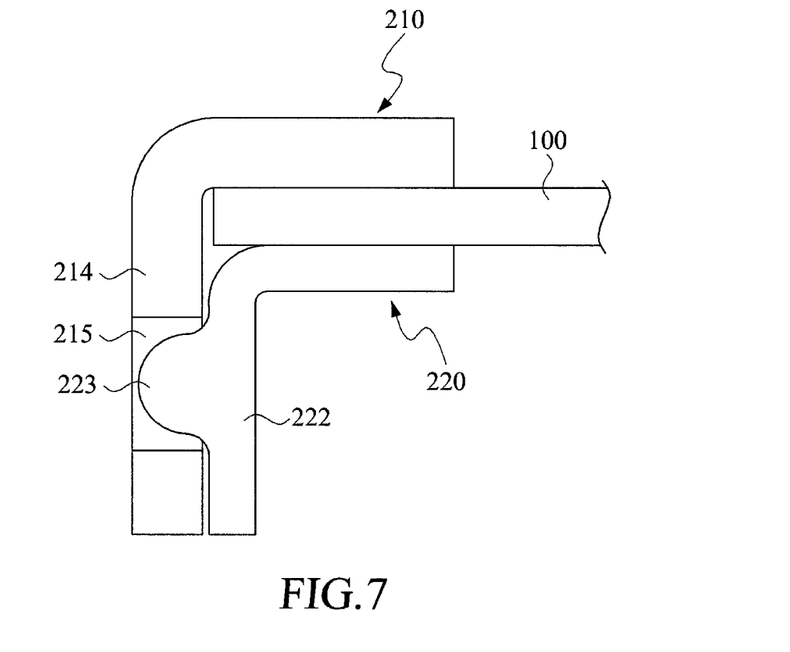
FIG. 7 shows a first type engagement structure employed in the heat dissipation device of the present invention.

FIG. 7 shows a first type engagement structure employed in the heat dissipation device of the present invention. Also referring to FIGS. 2 and 3, the upper and lower casing halves 210, 220 are mounted onto the graphene plate 100 via the first engagement structure 214, which extends downwardly from one lateral side of the upper casing half 210 while the second engagement structure 222 extends downwardly from one lateral side of the lower casing half 22. The second engagement structure 222 includes an engaging projection 223 extending into and engaging an engaging recess 215 of the first engagement structure 214.

Figure 8:
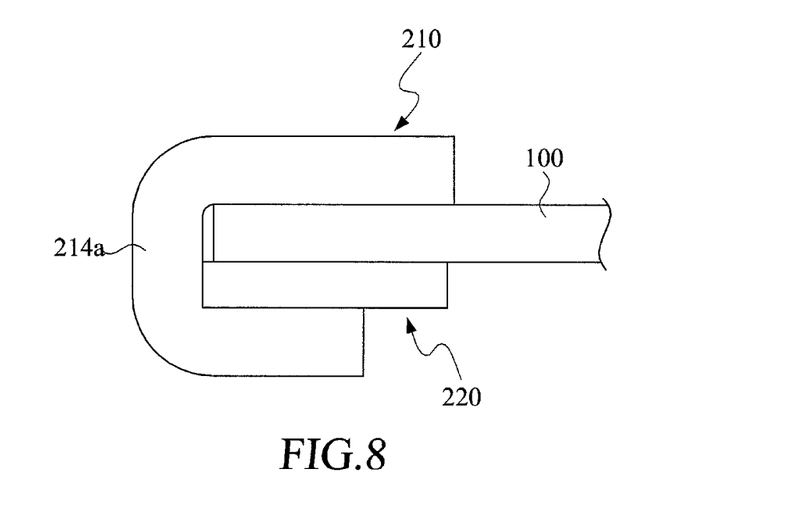
FIG. 8 shows a second type engagement structure employed in the heat dissipation device of the present invention.

FIG. 8 shows a second type engagement structure employed in the heat dissipation device of the present invention. The second type engagement structure is different from the first type engagement structure in that there is no second engagement structure 222 present since the first engagement structure 214a is generally U-shaped and extends downwardly from one lateral side of the upper casing half 210 and bends inwardly relative to the lower casing half 220 in order to clamp the assembly of the lower casing half 220 and the graphene plate 100.

Figure 9:
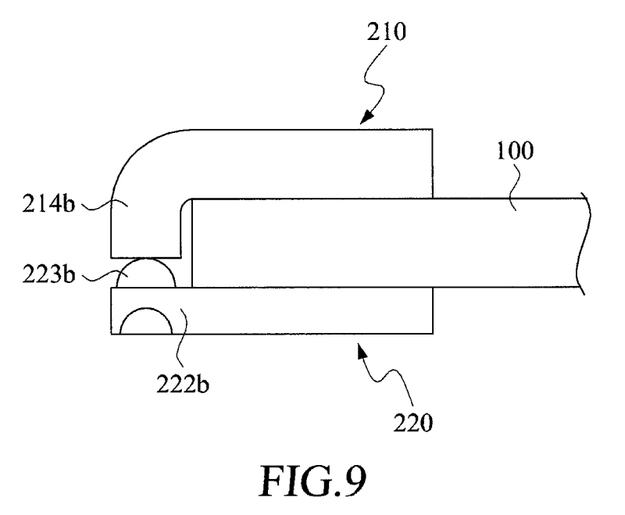
FIG. 9 shows a third type engagement structure employed in the heat dissipation device of the present invention.

FIG. 9 shows a third type engagement structure employed in the heat dissipation device of the present invention. The third type engagement structure is different from the first type engagement structure in that the second engagement structure 222b extends outwardly and horizontally from a lower side of the lower casing half 220 and is formed with an engaging projection 223b while the first engagement structure 214b extends downwardly from one lateral side of the upper casing half 210 to abut against the engaging projection 223b. In case the upper and lower casing halves 210, 220 are made from metal or plastic material, ultrasound welding process can be implemented in order to melt the engaging projection 223b, thereby integrally coupling the upper and lower casing halves 210, 220 together. In the event, the upper and lower casing halves 210, 220 are made from metal material, electric resistance welding process can be implemented in order to melt the engaging projection 223b, thereby integrally coupling the upper and lower casing halves 210, 220 together. Since the ultrasound welding process or the electric resistance welding process is well known in the art, a detailed description thereof is omitted herein for the sake of brevity.

Figure 10:
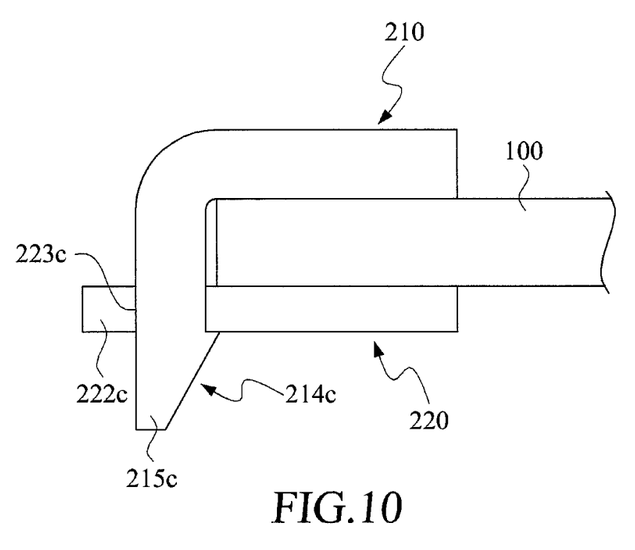
FIG. 10 shows a fourth type engagement structure employed in the heat dissipation device of the present invention.

FIG. 10 shows a fourth type engagement structure employed in the heat dissipation device of the present invention. The fourth type engagement structure is different from the first type engagement structure in that the second engagement structure 222c extends outwardly and horizontally from a lower side of the lower casing half 220 and is formed with an engaging hole 223c while the first engagement structure 214c extends downwardly from one lateral side of the upper casing half 210 and has a distal barbed section 215c extending through the engaging hole 223c, thereby clamping the graphene plate 100 between the upper and lower casing halves 210, 220.

Figure 11:
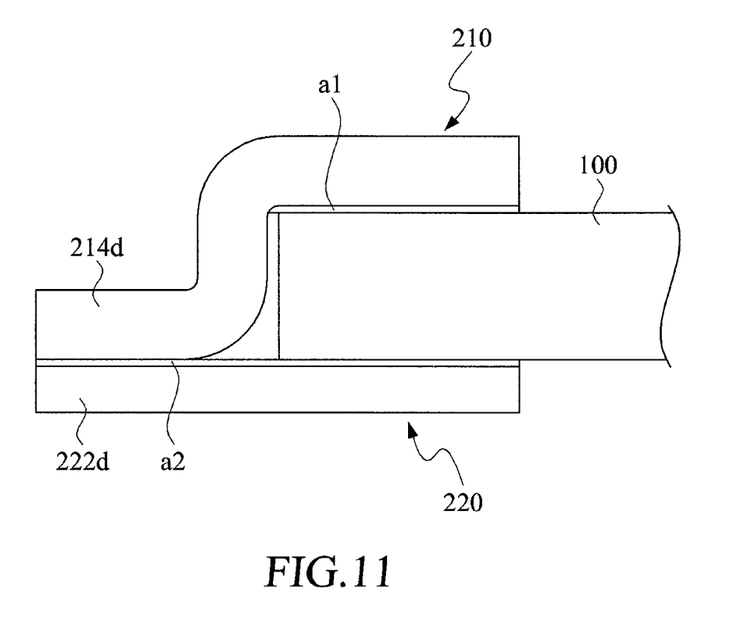
FIG. 11 shows a fifth type engagement structure employed in the heat dissipation device of the present invention.

FIG. 11 shows a fifth type engagement structure employed in the heat dissipation device of the present invention. The fifth type engagement structure is different from the first type engagement structure in that no engaging recess or hole and engaging projection are employed. The first engagement structure 214d is generally inverted L-shaped and extends downwardly from one lateral side of the upper casing half 210 and then turns outwardly and horizontally in order to overlap an outward-and-horizontal second engagement structure 222d extending from the lower side of the lower casing half 220. A first appropriate amount of adhesive (a1) is squeezed into a space between the first engagement structure 214d and the graphene plate 100 while a second appropriate amount of adhesive (a2) is squeezed into a space between the first engagement structure 214d and the second engagement structure 222d, and between the second engagement structure 222d and the graphene plate 100, thereby coupling the assembly of the upper and lower casing halves 210, 220 and the graphene plate 100.

As described above, in the heat dissipation device of the present invention, a graphene plate of relatively thin structure serves as the heat dissipation medium for transferring the heat generated by the heat producing element to the heat dissipating element. In addition, the main casing itself is substantially flat, encloses and overlaps the graphene plate from top and bottom surfaces thereof so as to effectively reduce an overall height of the heat dissipation device of the present invention. In the event, the heat generated by the heat producing element is relatively high, the graphene plate can be mounted on the metal casing of the electronic device or onto a thin metal plate of the metal casing in order to increase the overall heat dissipating area. Since the metal casing itself can dissipate heat therefrom, the overall height of the heat dissipation device of the present invention is reduced when compared to the prior art ones.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A heat dissipation device for transferring heat generated by a heat-producing element to a heat-dissipating element, comprising:
   a graphene plate, in the form of relatively thin structure, having a first dissipation portion and a second dissipation portion extending from said first dissipation portion;
   a main casing, generally a planar structure, enclosing said graphene plate therein, and having a first dissipation opening exposing said first dissipation portion of said graphene plate; and
   a supporting plate extending integrally from said main casing in order to support said second dissipation portion of said graphene plate;
   wherein, during assembly, the heat-producing element is inserted through said first dissipation opening in order to mount the same on said first dissipation portion of said graphene plate while the heat-dissipating element is mounted on said second dissipation portion of said graphene plate;

wherein said graphene plate has top and bottom surfaces, said top surface of said first dissipation portion of said graphene plate being exposed from said first dissipation opening of said main casing while the heat producing element is mounted on said top surface of said first dissipation portion;

said graphene plate further has a third dissipation portion extending from said first dissipation portion, said main casing further having a second dissipation opening exposing said third dissipation portion of said graphene plate; and said main casing further has a third dissipation opening exposing said bottom surface of said third dissipation portion while said top surface of said third dissipation portion is exposed from said second dissipation opening.

2. The heat dissipation device according to claim 1, wherein said supporting plate is provided with a foldable strip, which is attached integrally to said main casing in such a manner to offer a height difference between said first and second dissipation portions.

3. The heat dissipation device according to claim 1, wherein after assembly said supporting plate is disposed on said top surface of said second dissipation portion while the heat dissipating element is attached to said bottom surface of said second dissipation portion.

4. The heat dissipation device according to claim 1, further comprising either another heat producing element or another heat dissipating element mounted on said third dissipation portion of said graphene plate via said second dissipation opening.

5. The heat dissipation device according to claim 1, wherein said main casing includes an upper casing half enclosing said graphene plate from said top surface and a lower casing half enclosing said graphene plate from said bottom surface thereof.

6. The heat dissipation device according to claim 1, wherein said main casing and said supporting plate are made from plastic materials.

7. The heat dissipation device according to claim 6, wherein said main casing and said supporting plate are mounted to said graphene plate via an insert molding process.

8. The heat dissipation device according to claim 1, wherein the heat dissipating element includes a metal casing, a relatively thin platelet or any heat sink having a plurality of dissipating fins.

* * * * *